(12) United States Patent
Ohashi et al.

(10) Patent No.: US 11,444,228 B2
(45) Date of Patent: Sep. 13, 2022

(54) LIGHT EMITTING DEVICE AND DISPLAY APPARATUS

(71) Applicant: SONY CORPORATION, Tokyo (JP)

(72) Inventors: Tatsuo Ohashi, Kanagawa (JP); Goshi Biwa, Kanagawa (JP); Akira Ohmae, Kanagawa (JP); Yusuke Kataoka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 97 days.

(21) Appl. No.: 16/763,217

(22) PCT Filed: Oct. 5, 2018

(86) PCT No.: PCT/JP2018/037383
§ 371 (c)(1),
(2) Date: May 11, 2020

(87) PCT Pub. No.: WO2019/097893
PCT Pub. Date: May 23, 2019

(65) Prior Publication Data
US 2020/0335677 A1    Oct. 22, 2020

(30) Foreign Application Priority Data
Nov. 20, 2017   (JP) .............................. JP2017-222580

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 33/10* (2013.01);
(Continued)

(58) Field of Classification Search
CPC . H01L 33/58; H01L 2933/0058; H01L 33/60; H01L 33/62; H01L 33/10; H01L 25/0753
See application file for complete search history.

(56) References Cited

U.S. PATENT DOCUMENTS 9,461,023 B2    10/2016  West
2006/0284195 A1 12/2006  Nagai
(Continued)

FOREIGN PATENT DOCUMENTS

CN    103904095 A    7/2014
CN    104170102 A    11/2014
(Continued)

OTHER PUBLICATIONS

International Search Report and Written Opinion of PCT Application No. PCT/JP2018/037383, dated Jan. 8, 2019, 11 pages of ISRWO.

Primary Examiner — Feifei Yeung Lopez
(74) Attorney, Agent, or Firm — Chip Law Group

(57) ABSTRACT

A light emitting device of one embodiment of the present disclosure includes: a substrate; a light emitting element disposed above the substrate, and having electrodes on respective upper surface and lower surface of the light emitting element; and a light shielding layer provided between the substrate and the light emitting element.

12 Claims, 6 Drawing Sheets

(51) Int. Cl.
*H01L 33/38* (2010.01)
*H01L 33/60* (2010.01)
*H01L 33/58* (2010.01)
*H01L 33/10* (2010.01)
*H01L 33/20* (2010.01)
*H01L 33/30* (2010.01)
*H01L 33/32* (2010.01)
*H01L 33/54* (2010.01)
*H01L 33/56* (2010.01)

(52) U.S. Cl.
CPC .............. *H01L 33/38* (2013.01); *H01L 33/58* (2013.01); *H01L 33/60* (2013.01); *H01L 33/20* (2013.01); *H01L 33/30* (2013.01); *H01L 33/32* (2013.01); *H01L 33/54* (2013.01); *H01L 33/56* (2013.01); *H01L 2933/0058* (2013.01)

(56) References Cited

U.S. PATENT DOCUMENTS

| | | | |
|---|---|---|---|
| 2012/0248481 A1* | 10/2012 | Seo | H01L 33/486 257/98 |
| 2014/0183572 A1 | 7/2014 | Kim et al. | |
| 2015/0021642 A1 | 1/2015 | Nakabayashi | |
| 2015/0041844 A1 | 2/2015 | Okahisa et al. | |
| 2018/0033922 A1* | 2/2018 | Iwakura | H01L 33/62 |
| 2018/0182941 A1* | 6/2018 | Yuasa | H01L 33/60 |
| 2018/0219144 A1* | 8/2018 | Perkins | H01L 33/42 |

FOREIGN PATENT DOCUMENTS

| | | |
|---|---|---|
| CN | 104300068 A | 1/2015 |
| EP | 1658642 A2 | 5/2006 |
| EP | 2495761 A1 * | 5/2012 |
| EP | 2750193 A2 | 7/2014 |
| EP | 2810308 A1 | 12/2014 |
| EP | 2827388 A1 | 1/2015 |
| JP | 10-190066 A | 7/1998 |
| JP | 11-510968 A | 9/1999 |
| JP | 2005-079202 A | 3/2005 |
| JP | 2009-194052 A | 8/2009 |
| JP | 2009-212134 A | 9/2009 |
| JP | 2010-080830 A | 4/2010 |
| JP | 2011-108747 A | 6/2011 |
| JP | 2011-151187 A | 8/2011 |
| JP | 2012-175066 A | 9/2012 |
| JP | 2014-131038 A | 7/2014 |
| JP | 2015-023162 A | 2/2015 |
| JP | 2015-035438 A | 2/2015 |
| KR | 10-2014-0084581 A | 7/2014 |
| KR | 10-2015-0032926 A | 3/2015 |
| TW | 200514281 A | 4/2005 |
| TW | 201334226 A | 8/2013 |
| TW | 201511353 A | 3/2015 |
| TW | 201735348 A | 10/2017 |
| WO | 97/048138 A2 | 12/1997 |
| WO | 2005/022654 A2 | 3/2005 |
| WO | 2013/063030 A1 | 5/2013 |
| WO | 2013/116114 A1 | 8/2013 |
| WO | 2017/169269 A1 | 10/2017 |

* cited by examiner

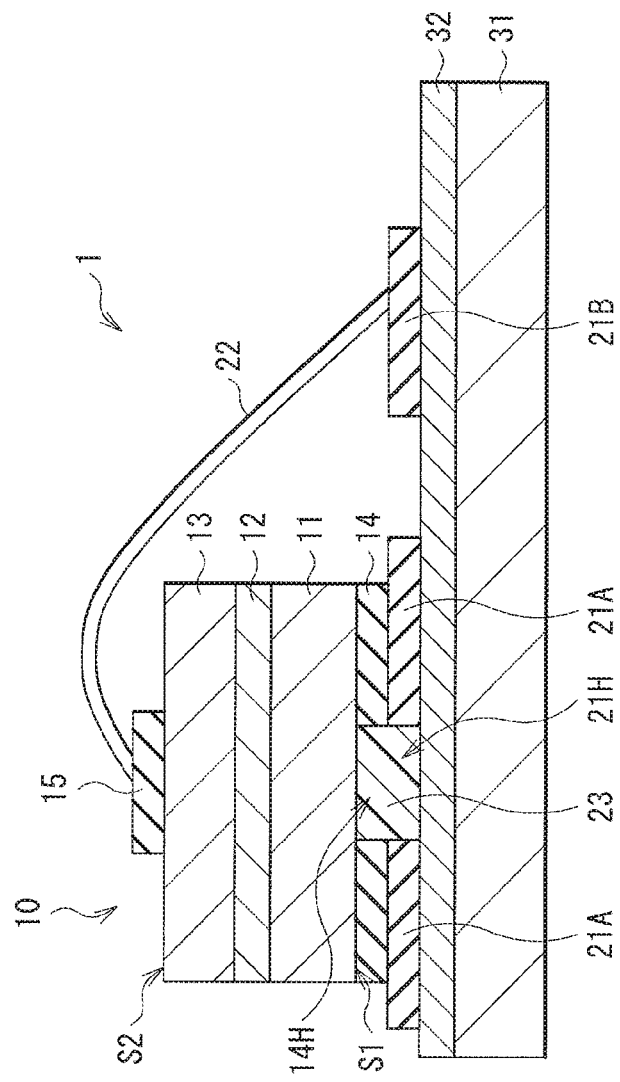
[FIG. 1]

[FIG. 2]
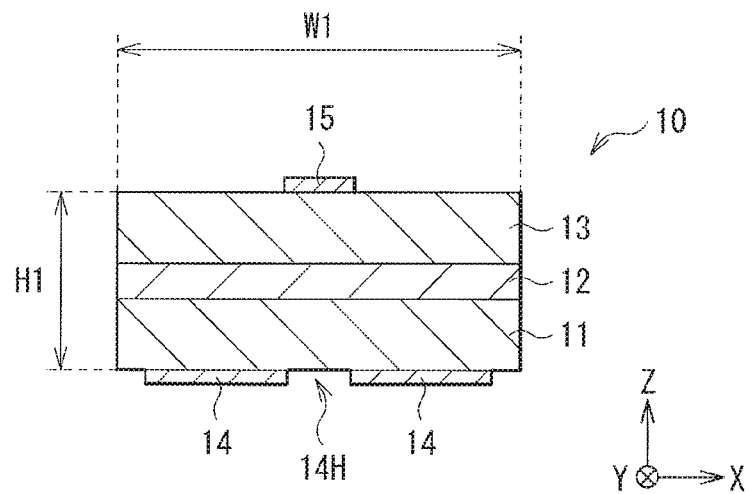
[FIG. 3]
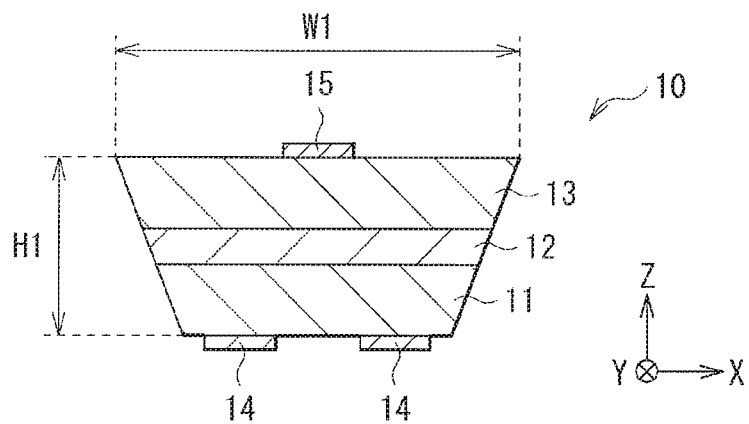

[FIG. 4]
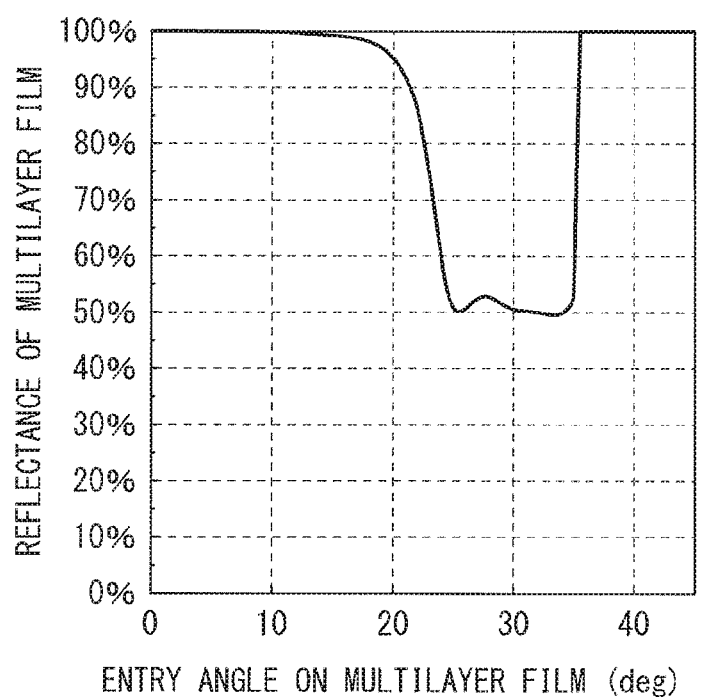

[FIG. 5A]
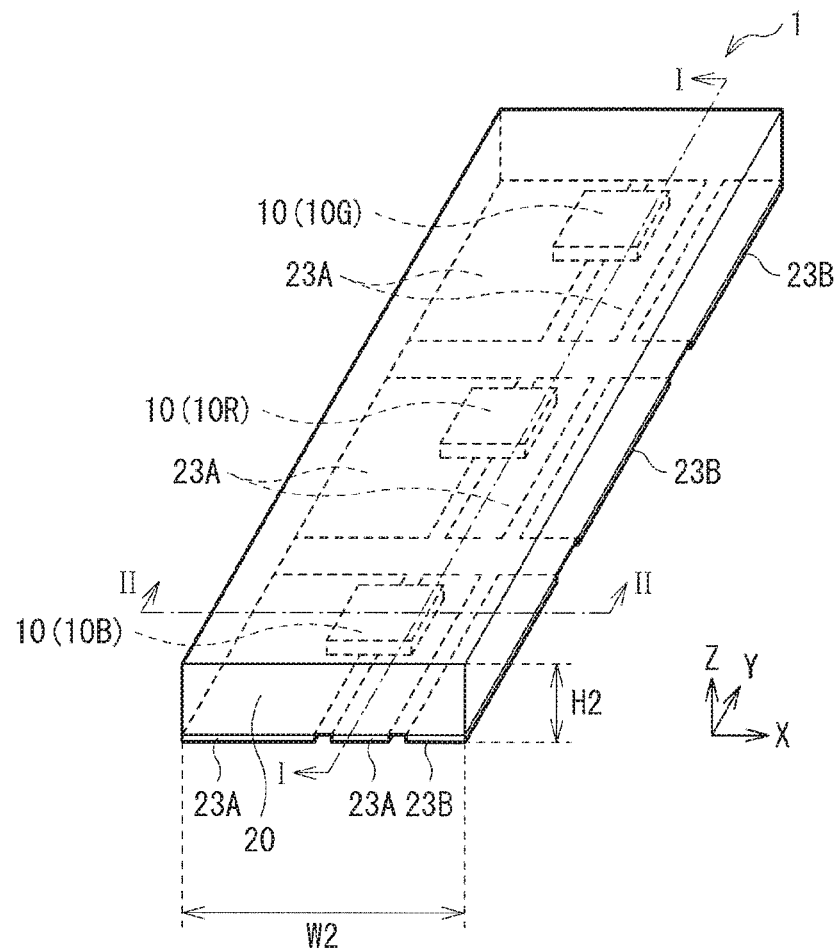
[FIG. 5B]
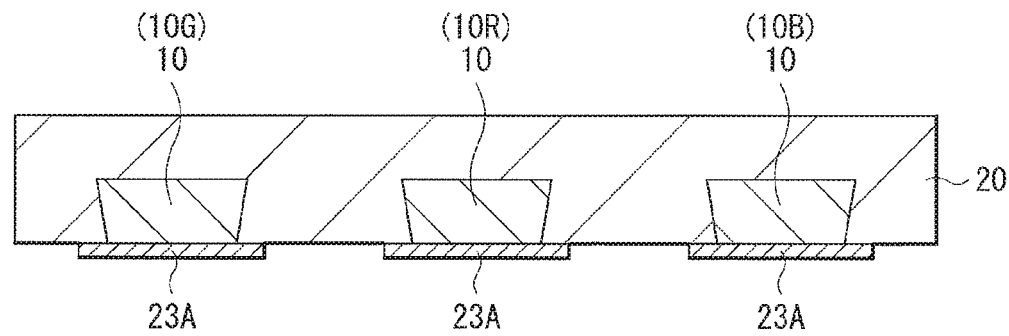

[FIG. 6]
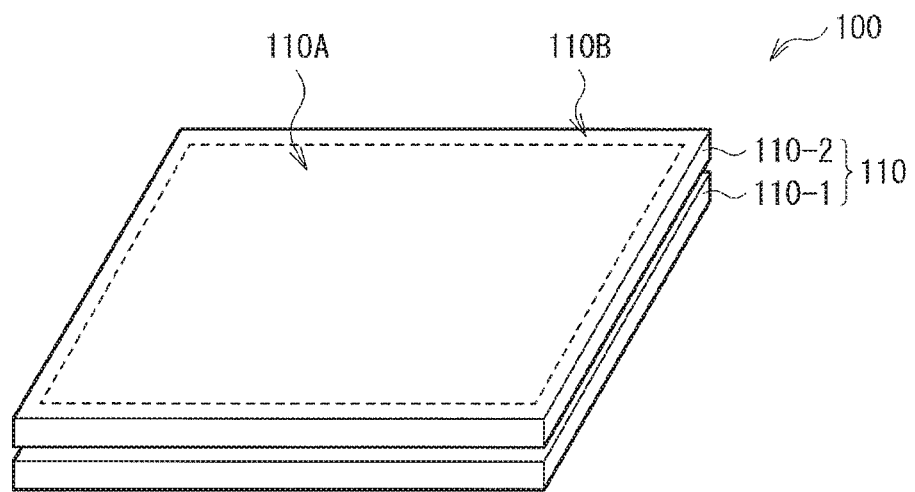
[FIG. 7]
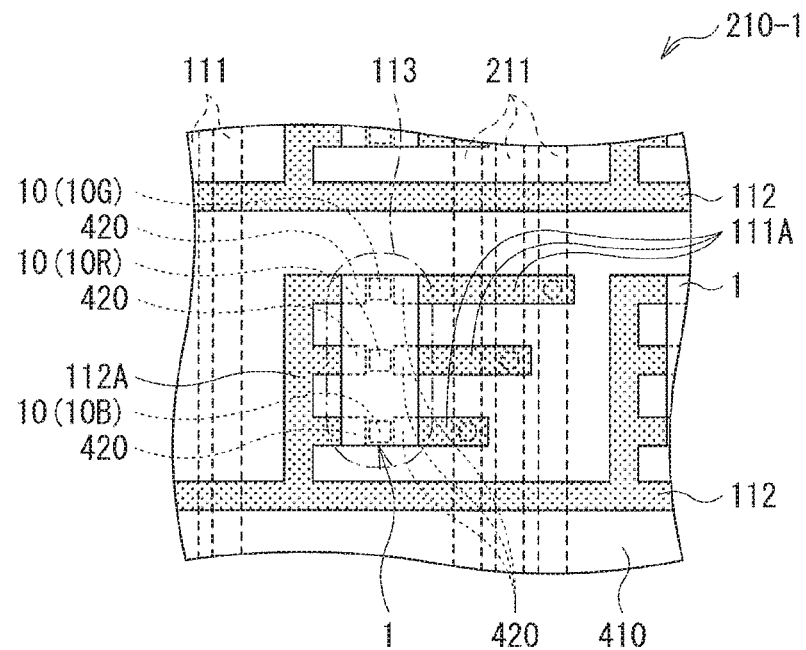

[FIG. 8]
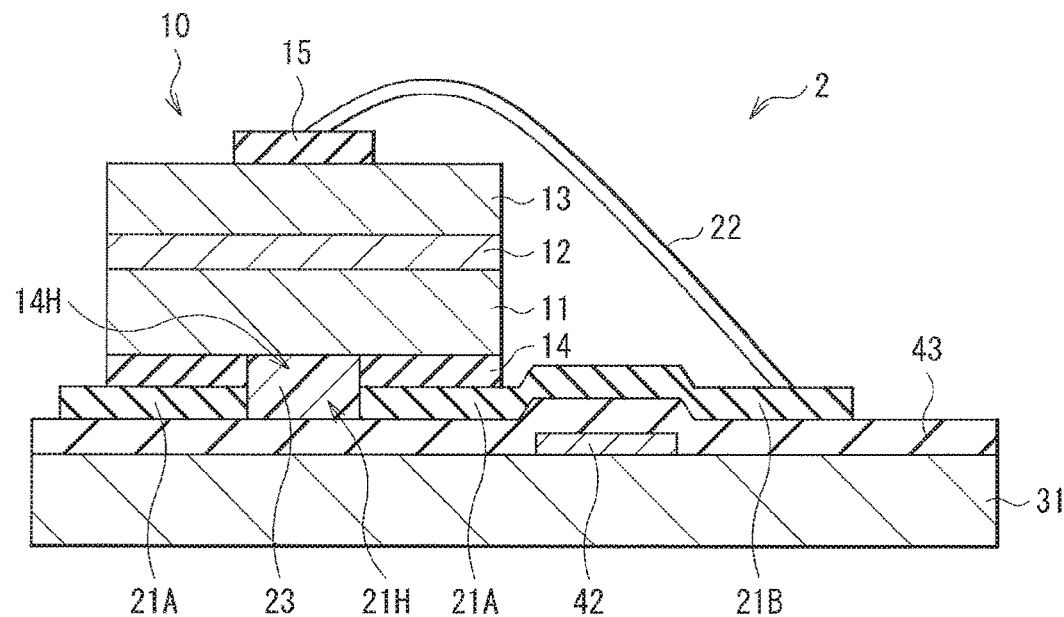
[FIG. 9]
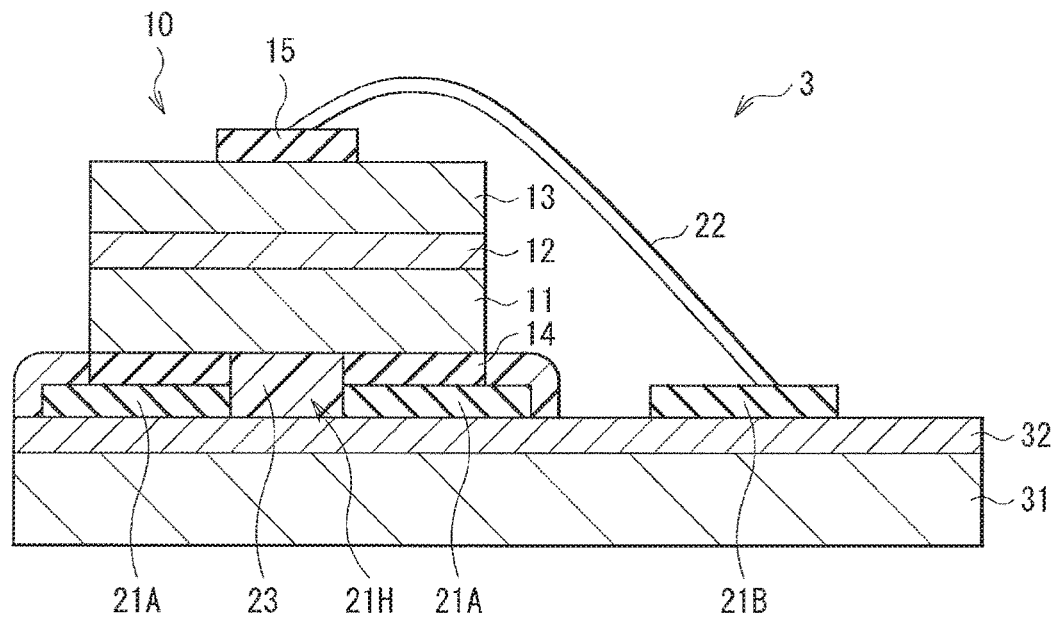

LIGHT EMITTING DEVICE AND DISPLAY APPARATUS

CROSS REFERENCE TO RELATED APPLICATIONS

This application is a U.S. National Phase of International Patent Application No. PCT/JP2018/037383 filed on Oct. 5, 2018, which claims priority benefit of Japanese Patent Application No. JP 2017-222580 filed in the Japan Patent Office on Nov. 20, 2017. Each of the above-referenced applications is hereby incorporated herein by reference in its entirety.

TECHNICAL FIELD

The present disclosure relates to a light emitting device including a solid-state light emitting element, and a display apparatus including the light emitting device.

BACKGROUND ART

As lighter and thinner displays, light emitting diode (LED) displays using LEDs for display pixels have recently drawn attention. LED displays have no viewing angle dependence in which contrast or color shade of the display varies depending on the viewing angle, and are responsive in a case where the colors are changed. Therefore, for example, like a display apparatus disclosed in PTL 1, various LED displays have been developed in order to improve fabrication yield and make the display apparatuses thinner.

CITATION LIST

Patent Literature

PTL 1: Japanese Unexamined Patent Application Publication No. 2012-175066

SUMMARY OF THE INVENTION

Meanwhile, display apparatuses including LEDs serving as light emitting elements have been desired to improve its reliability.

It is desirable to provide a light emitting device with improved reliability and a display apparatus with improved reliability.

A light emitting device of one embodiment of the present disclosure includes: a substrate; a light emitting element disposed above the substrate, and having electrodes on respective upper surface and lower surface of the light emitting element; and a light shielding layer provided between the substrate and the light emitting element.

A display apparatus of one embodiment of the present disclosure includes: a display panel having a plurality of pixels; and a drive circuit that drives the plurality of pixels on the basis of a picture signal unit. The plurality of pixels included in the display panel includes a plurality of the light emitting devices, according to one embodiment of the disclosure described above, mounted above a substrate.

According to the light emitting device of one embodiment of the present disclosure and the display apparatus of one embodiment of the present disclosure, the light shielding layer is disposed between the substrate and the light emitting element that has the electrodes on the respective upper and lower surfaces thereof. This makes it possible to reduce deterioration of the substrate due to light outputted from the light emitting element.

According to the light emitting device of one embodiment of the present disclosure and the display apparatus of one embodiment of the present disclosure, the light shielding layer is disposed between the substrate and the light emitting element that has the electrodes on the respective upper and lower surfaces thereof, thereby reducing deterioration of the substrate due to light outputted from the light emitting element. This makes it possible to improve reliability of the light emitting device and reliability of the display apparatus including the same.

It is to be noted that effects of the present disclosure are not necessarily limited to the effects described above, and may include any of effects that are described herein.

BRIEF DESCRIPTION OF DRAWING

FIG. 1 is a schematic cross-sectional view of one example of a configuration of a light emitting device according to a first embodiment of the present disclosure.

FIG. 2 is a schematic cross-sectional view of one example of a configuration of a light emitting element illustrated in FIG. 1.

FIG. 3 is a schematic cross-sectional view of another example of the configuration of the light emitting element illustrated in FIG. 1.

FIG. 4 is a characteristic diagram illustrating a multilayer reflective film constituting a light shielding layer illustrated in FIG. 1.

FIG. 5A is a perspective view of one example of a configuration of a light emitting device having a package structure.

FIG. 5B is a schematic cross-sectional view of the light emitting device taken along line I-I illustrated in FIG. 5A.

FIG. 6 is a perspective view of one example of a schematic configuration of a display apparatus of the present disclosure.

FIG. 7 is a plan view of one example of a layout of a surface of a mounting board illustrated in FIG. 6.

FIG. 8 is a schematic cross-sectional view of a light emitting device according to a second embodiment of the present disclosure.

FIG. 9 is a schematic cross-sectional view of a light emitting device according to a modification example of the present disclosure.

MODES FOR CARRYING OUT THE INVENTION

Hereinafter, embodiments of the present disclosure will be described in detail with reference to the drawings. The following description is one specific example of the present disclosure, and the present disclosure should not be limited to the following embodiments. Moreover, the present disclosure is not limited to positions, dimensions, dimension ratios, and other factors of respective elements illustrated in the drawings. It should be noted that the description is given in the following order.

1. First Embodiment (An example of a light emitting device including a light shielding layer provided between a substrate and a light emitting element, the light shielding layer being configured by a distributed Bragg reflector (DBR))

1-1. Configuration of Light Emitting Device 1-2. Configuration of Display 1-3. Workings and Effects 2. Second Embodiment (An example of a light emitting device including a light shielding layer provided between substrate and a light emitting element, the light shielding layer being configured by a metal film)
3. Modification Example (An example in which an adhesive film is provided around a lower electrode of the light emitting element and an electrode pad)

1. First Embodiment

FIG. 1 schematically illustrates the cross-sectional configuration of a light emitting device (a light emitting device 1) according to the first embodiment of the present disclosure. The light emitting device 1 is preferably applicable as a display pixel of a display apparatus called, e.g., an LED display (for example, a display apparatus 100; see FIG. 6). For example, the light emitting device 1 of the present embodiment has a configuration in which a light shielding layer 32 is provided between a substrate 31 and a light emitting element 10 disposed above the substrate 31.

(1-1. Configuration of Light Emitting Device)

The light emitting device 1 has a configuration in which the light emitting element 10 is mounted above the substrate 31 through, e.g., terminal electrodes 21. The light emitting element 10 has a first electrode 14 on a first surface (a lower surface thereof, a surface S1) that opposes the substrate 31 and a second electrode 15 on a second surface (an upper surface thereof, a surface S2) that is positioned on the opposite side of the first surface S1. The terminal electrodes 21 are disposed at predetermined intervals, and include a terminal electrode 21A and a terminal electrode 21B that are electrically separated from each other. The terminal electrode 21A is electrically coupled to the first electrode 14, and the terminal electrode 21B is electrically coupled to the second electrode 15. The light shielding layer 32 is disposed under the terminal electrode 21, specifically between the substrate 31 and the terminal electrodes 21.

The light emitting element 10 is a solid-state light emitting element that emits light with a predetermined wavelength band from an upper surface, and is specifically an LED chip. The LED chip refers to a chip in a state of being carved out from a wafer used for crystal growth, not a chip package covered with molded resin. The LED chip has a width of, e.g., 5 µm or more and 100 µm or less (a width W1), and is a so-called micro LED. The LED chip is substantially square-shaped in plan view, for example. The LED chip is a thin sheet, and has an aspect ratio (height H1/width W1) (see FIG. 2) of 0.1 or more and less than 10, for example. The light emitting element 10 has a height H1 of, e.g., 3 µm or more and 50 µm or less.

The light emitting element 10, as illustrated in, e.g., FIG. 2, has a multilayer structure including a first conduction type layer 11, an active layer 12, and a second conduction type layer 13 that are sequentially laminated. The first conduction type layer 11, the active layer 12, and the second conduction type layer 13 include, e.g., an InGaN-based semiconductor material or an AlGaInP-based semiconductor material. The first electrode 14 and the second electrode 15 include a highly reflective metal material such as Ag (silver). Although not illustrated, each of the light emitting elements 10 may include an insulating film covering the side surface thereof and a region, of the first surface, where the first electrode 14 is not formed.

The side surface of the light emitting element 10 is orthogonal to the lamination direction (e.g., a Z axis direction), as illustrated in, e.g., FIG. 2. Further, the side surface of the light emitting element 10 may be a tilted surface intersecting with the lamination direction in consideration of light extraction efficiency. As illustrated in, e.g., FIG. 3, each of the light emitting elements 10 may have a tilted side surface so as to have an inverted trapezoid cross section.

The first conduction type layer 11 is provided with the first electrode 14 on a lower surface thereof (the surface S1). The first electrode 14 is in contact with, and electrically coupled to, the first conduction type layer 11. Although the first electrode 14 may be provided over the entire lower surface (the surface S1), an opening 14H may be provided in the intermediate portion of the lower surface, as illustrated in, e.g., FIG. 1.

The second conduction type layer 13 is provided with the second electrode 15 on an upper surface thereof (the surface S2). The second electrode 15 is in contact with, and electrically coupled to, the second conduction type layer 13. Each of the first electrode 14 and the second electrode 15 may be a single electrode, or a plurality of electrodes. It is to be noted that, hereinafter, as illustrated in FIGS. 2 and 3, both the first electrode 14 and the second electrode 15 are assumed to be a single electrode.

As described above, the terminal electrodes 21 are disposed at predetermined intervals, and include the terminal electrode 21A and the terminal electrode 21B that are electrically separated from each other. The terminal electrode 21A and the terminal electrode 21B are formed on the same surface, e.g., the substrate 31. Each of the terminal electrodes 21A and 21B mainly includes Cu (copper). At least a portion of each of the terminal electrodes 21A and 21B may be covered with a material that is difficult to be oxidized, such as Au (gold). For example, the entire surfaces of the terminal electrodes 21A and 21B may be covered with a material that is difficult to be oxidized, such as Au or Ti. The respective terminal electrodes 21 serve not only as an input-output terminal of the light emitting device 1 but also as reflecting the light emitted from the active layer 12 toward the second conduction type layer 13.

The terminal electrode 21A is disposed above the substrate 31 in, e.g., a region where the substrate 31 opposes the light emitting element 10, and is electrically coupled to the first electrode 14 of the light emitting element 10 through a joint material (not illustrated). The joint material includes plating metal formed by, e.g., plating. Further, the joint material may be formed by another method other than the plating. For example, the terminal electrode 21A has an opening 21H in a region that opposes the light emitting element 10. This opening 21H is provided so as to correspond to the opening 14H of the first electrode 14 of the light emitting element 10, for example. The opening 14H and the opening 21H are filled with, e.g., an adhesive 23. This allows the light emitting element 10 to be held above the substrate 31. An example of the adhesive 23 includes a photosensitive resin.

The terminal electrode 21B is disposed at a location that is above the substrate 31 and that is positioned on outer side of the region in which the substrate 31 opposes the light emitting element 10, and is electrically coupled to the second electrode 15 of the light emitting element 10 through a wiring line 22 (conductive line). The wiring line 22 is in contact with the second electrode 15 on the upper surface of the light emitting element 10, and is electrically coupled to the second electrode 15.

The wiring line 22 may be configured by, e.g., a wire or may include plated metal. In a case where the wiring line 22 includes the plated metal, the wiring line 22 specifically includes seed metal and the plated metal laminated on the upper surface of the seed metal. Here, the seed metal, similar to the above-described case, includes, e.g., titanium (Ti) or copper (Cu) using a film forming process such as a sputtering process, a physical vapor deposition (PVD) process or a chemical vapor deposition (CVD) process. The plated metal is, similar to the above-described case, formed by a plating process that is one of film forming processes. Further, examples of the plating include electrolytic plating, and electroless plating. The wiring line 22 is formed by a plating process. The wiring line 22 is electrically and mechanically stable because of selection of the optimum growth method. The wiring line 22 is, e.g., conformally formed (e.g., to have a uniform thickness), or is formed to have, e.g., a portion coupled to the second electrode 15, the portion being thicker than other portions.

The substrate 31 has, e.g., a wiring line structure on front and back surfaces thereof, and is a multilayer substrate where electrical coupling between layers is achieved through via holes. Specifically, for example, the substrate 31 is a build-up substrate, and has a core substrate and build-up layers in contact with the respective front and back surfaces of the core substrate. The core substrate is provided to secure, e.g., rigidity of the substrate 31, and includes, e.g., a glass epoxy substrate. The build-up layer includes one or more wiring line layers. The surface of the substrate 31 is provided with wiring lines constituting, e.g., a drive integrated circuit (IC) that drives the light emitting element 10, the wiring lines being covered with, e.g., a resin layer. The substrate 31 includes, e.g., a plurality of electrode pads serving as external terminals on the back surface thereof.

It is desirable that the light shielding layer 32 be formed on, e.g., the entire surface of the substrate 31, have wavelength selectivity, and transmit light with a wavelength other than a wavelength of light outputted from the light emitting element 10. For example, the light shielding layer 32 preferably transmits light with a wavelength other than the wavelength of light outputted from the light emitting element 10 and other than wavelengths within a wavelength range ±50 nm from the wavelength of the light outputted from the light emitting element 10. As one specific example, the light shielding layer 32 preferably has a multilayer structure that transmits light with a wavelength (for example, 250 nm or more and 350 nm or less) necessary for, e.g., curing resin (not illustrated) for holding the light emitting element 10 above the substrate 31, and that reflects a light emission wavelength. It is possible to form such a light shielding layer 32 by using, e.g., a wavelength control layer. For example, the wavelength control layer has a configuration using a photonic crystal such as distributed Bragg reflector (DBR).

Examples of such a configuration include structures in which two single-layer films, including silicon oxide ($SiO_2$), silicon nitride (SiN), titanium oxide ($TiO_2$), and aluminum oxide ($Al_2O_3$), whose materials having different refractive indexes are combined together and are alternately laminated. For example, in a case where an $SiO_2$ film and a $TiO_2$ film are combined together, and five pairs of these films with each thickness of $\lambda/4$ are alternately laminated to from a multilayer reflective film (the light shielding layer 32), a reflectance as illustrated in FIG. 6 is obtained with respect to the wavelength of 460 nm, for example. It is to be noted that the above configuration is one example, and may be a multilayer structure with five pairs or less of these films or five pairs or more of these films, or may be a multilayer structure by another combination other than that of the $SiO_2$ film and the $TiO_2$ film.

The light shielding layer 32 may have a configuration other than the DBR. For example, the light shielding layer 32 may be formed using, e.g., a typical color filter or three-dimensional photogenic crystal.

Moreover, as illustrated in, e.g., FIGS. 5A and 5B, the light emitting device 1 may have a small package structure in which a plurality of light emitting elements 10 is covered with resin (an insulator 20) that is small in thickness (a light emitting device 1A).

FIG. 5A is a perspective view of a configuration of the light emitting device 1A. FIG. 5B schematically illustrates a cross-sectional configuration taken along line I-I illustrated in FIG. 5A. Note that the cross-sectional configuration of the light emitting device 1 illustrated in FIG. 1 corresponds to the cross-section taken along line I-I in FIG. 5A. As illustrated in FIG. 5A, the light emitting device 1A includes three light emitting elements 10. The light emitting elements 10 are disposed inside the light emitting device 1A, and, as illustrated in, e.g., FIG. 5A, are arranged in, e.g., a line with a predetermined interval being provided with respect to another light emitting element. The interval of two adjacent light emitting elements 10 is equal to or wider than the size of each of the light emitting elements 10. Note that such an interval may be narrower than the size of each of the light emitting elements 10 depending on the case. The interval between the side surface of the light emitting element 10 and the side surface of the light emitting device 1A is, e.g., equal to or more than half the size of each of the light emitting elements 10.

Each of the light emitting elements 10 emits light with a wavelength bandwidth different from that of light emitted from other light emitting elements 10. For example, as illustrated in FIG. 5A, the three light emitting elements 10 include a light emitting element 10G that emits green band right, a light emitting element 10R that emits red band right, and a light emitting element 10B that emits blue band right. The light emitting element 10G is disposed close to a side of the light emitting device 1A, for example. The light emitting element 10B is disposed close to another side of the light emitting device 1A, for example, the another side being different from the side close to the light emitting element 10G. The light emitting element 10R is disposed between, e.g., the light emitting element 10G and the light emitting element 10B. It is to be noted that the position of each of the light emitting elements 10R, 10G, and 10B is not limited thereto. In the following, however, there may be cases where positional relation of other constituent elements is described on the basis of an assumption that the light emitting elements 10R, 10G, and 10B are disposed at the positions as exemplified above.

The light emitting device 1A further includes, as illustrated in FIGS. 5A and 5B, a chip-shaped insulator 20 in which the each of light emitting elements 10R, 10G, and 10B is embedded. In addition, as with the light emitting device 1, in the light emitting device 1A, each of the light emitting elements 10R, 10G, and 10B includes the terminal electrodes 21A and 21B, and the wiring line 22.

The insulator 20 surrounds and holds each of the light emitting elements 10R, 10G, and 10B from at least the side and upper surfaces of each of the light emitting elements 10R, 10G, and 10B. The insulator 20 further includes the wiring line 22. That is, the wiring line 22 is embedded in the insulator 20. The insulator 20 includes, e.g., a resin material such as polyimide. It is to be noted that the insulator 20 may be obtained by curing of transparent resin having resistance to light and sensitivity to light. The aspect ratio of the insulator 20 (height H2/width W2 of the upper surface) is, e.g., less than one.

As illustrated in, e.g., FIGS. 5A and 5B, the insulator 20 has a flat surface on an upper surface and a lower surface thereof. On the upper surface of the insulator 20, no particular structure is disposed, and the upper surface of the insulator 20 is in contact with the outside (for example, air). In contrast, on the lower surface of the insulator 20, the terminal electrodes 21A and 21B are disposed. As with the light emitting device 1, the terminal electrodes 21A and 21B are disposed at predetermined intervals, and are electrically separated from each other.

The insulator 20 is formed to be in contact with the side and upper surfaces of each of the light emitting elements 10R, 10G, and 10B. The insulator 20 is band-shaped (e.g., rectangular-shaped) and extends in the arrangement direction of each of the light emitting elements 10R, 10G, and 10B. The height H2 of the insulator 20 is higher than the height H1 of each of the light emitting elements 10R, 10G, and 10B. The width W2 of the upper surface of the insulator 20 is wider than the width W1 of each of the light emitting element 10R, 10G, and 10B.

(1-2. Configuration of Display Apparatus)

FIG. 6 is a perspective view of one example of a schematic configuration of a display apparatus 100. The display apparatus 100 is a so-called LED display, and for example, the light emitting device 1A is used as a display pixel. As illustrated in, e.g., FIG. 6, the display apparatus 100 includes a display panel 110 and a drive circuit that drives the display panel 110 (not illustrated).

The display panel 110 includes a mounting board 110-1 and a transparent substrate 110-2 that are overlaid with each other. The surface of the transparent substrate 110-2 serves as a picture display surface, and includes a display region 110A at the center portion thereof and a frame region 210B serving as a non-display region in the vicinity of the display region 110A. FIG. 7 illustrates one example of a layout of a region of a surface of the mounting board 110-1, the region being adjacent to the transparent substrate 110-2 and corresponding to the display region 110A.

In the region corresponding to the display region 110A in the surface of the mounting board 110-1, as illustrated in, e.g., FIG. 7, a plurality of data wiring lines 111 is arranged to extend in a predetermined direction, and is disposed in parallel at predetermined pitches. Further, for example, in the region corresponding to the display region 110A in the surface of the mounting board 110-1, a plurality of scan wiring lines 112 is arranged to extend in a direction intersecting with (e.g., orthogonal to) the data wiring line 111, and is disposed in parallel at predetermined pitches. The data wiring line 111 and the scan wiring line 112 includes, e.g., a conductive material such as Cu (copper).

The scan wiring line 112 is formed in, e.g., the outermost layer, and for example, on an insulating layer (not illustrated) formed on the surface of a base material. Furthermore, the base material of the mounting board 110-1 is, e.g., a glass substrate or a resin substrate, and the insulating layer on the base material includes, e.g., SiN, $SiO_2$, or $Al_2O_3$. In contrast, the data wiring line 111 is formed in a layer different from the outermost layer including the scan wiring line 112 (e.g., in a layer under the outermost layer), and for example, in the insulating layer on the base material. In addition to the scan wiring line 112, for example, a black is provided on the surface of the insulating layer as necessary. The black is provided to improve contrast, and includes a light-absorbing material. The black is formed on the surface of the insulating layer in at least a region where no pad electrode 420 is formed. It is to be noted that the black may be omitted as necessary.

A portion close to a portion where data wiring line 111 intersects with the scan wiring line 112 serves as the display pixel 113, and a plurality of display pixels 113 is arranged in matrix in the display region 110A. As illustrated in, e.g., FIG. 7, the light emitting device 1A including the plurality of light emitting elements 10 is mounted in each of the display pixels 113. In addition, FIG. 7 exemplifies a case where three light emitting elements 10 (10R, 10G, and 10B) constitute one display pixel 113, the light emitting element 10R is configured to emit red light, the light emitting element 10G is configured to emit green light, and the light emitting element 10B is configured to emit blue light.

As above, in the light emitting device 1A, each of the light emitting elements 10R, 10G, and 10B is provided with a pair of the terminal electrodes 21A and 21B. Further, one terminal electrode 21A is electrically coupled to, e.g., the data wiring line 111, and the other terminal electrode 21B is electrically coupled to, e.g., the scan wiring line 112. For example, the terminal electrode 21A is electrically coupled to a pad electrode 420 disposed at a tip of a branch 111A provided to the data wiring line 111. In addition, for example, the terminal electrode 21B is electrically coupled to a pad electrode 420 disposed at a tip of a branch 112A provided to the scan wiring line 112.

Each of the pad electrodes 420 is formed in, e.g., the outermost layer, and, as illustrated in, e.g., FIG. 7, is provided in a portion where each of the light emitting devices 1A is mounted. Here, the pad electrode 420 includes, e.g., a conductive material such as Au (gold).

The mounting board 110-1 is further provided with, for example, a plurality of columns (not illustrated) that regulates the interval between the mounting board 110-1 and the transparent substrate 110-2. The columns may be disposed in a region that opposes the display region 110A and may be disposed in a region that opposes the frame region 210B.

The transparent substrate 110-2 is configured by, e.g., a glass substrate or a resin substrate. In the transparent substrate 110-2, a surface adjacent to the light emitting device 1A may be flat, but is preferably a rough surface. The rough surface may be disposed in an entire region that opposes the display region 110A and may be disposed in only a region that opposes the display pixel 113. The rough surface has irregularities that are enough to scatter light, which has been emitted from the light emitting element 10, entered the rough surface. The irregularities of the rough surface may be produced by, e.g., sandblasting or dry-etching.

The drive circuit drives the plurality of display pixels 113 on the basis of a picture signal. The drive circuit includes, e.g., a data driver that drives the data wiring line 111 coupled to the display pixel 113, and a scan driver that drives the scan wiring line 112 coupled to the display pixel 113. The drive circuit may be, e.g., mounted on the mounting board 110-1, or may be provided separately from the display panel 110 and coupled to the mounting board 110-1 through a wiring line (not illustrated).

(1-3. Workings and Effects)

As described above, as lighter and thinner displays, LED displays using light emitting diodes (LEDs) for display pixels have recently drawn attention.

In general, a substrate structure in which an LED is mounted as a light emitting element has a surface including a wiring line layer covered with resin. In a case where, as a light emitting element, an LED having electrodes on respective upper and lower surfaces thereof is mounted on a substrate, a terminal electrode electrically coupled to the electrode (an upper electrode) provided on the upper surface is disposed to be spaced apart from the LED in order to prevent occurrence of short-circuit between the upper electrode and the electrode (a lower electrode) provided on the lower surface. This causes formation of a region in which resin on the substrate is exposed between two terminal electrodes electrically coupled to the respective upper and lower electrodes of the LED. If the resin exposed is irradiated with light (in particular, blue light) outputted from the LED, the resin may be deteriorated, which can result in, e.g., short-circuit. In particular, in a case where the upper electrode of the LED is coupled to the terminal electrode on the substrate through a wide wiring line, the light outputted from the LED is reflected toward the substrate due to the wiring line, thus causing the resin on the substrate to be more likely to be deteriorated.

In contrast, in the present embodiment, the light shielding layer 32 is formed between the substrate 31 and the light emitting element 10. This makes it possible to reduce deterioration of the substrate 31 due to light outputted from the light emitting element 10 and reflection light reflected by the wiring line 22 coupling the second electrode 15 and the terminal electrode 21B together.

As described above, in the light emitting device 1 in the present embodiment, the light shielding layer 32 is formed between the substrate 31 and the light emitting element 10. This reduces deterioration of the substrate 31 due to light outputted from the light emitting element 10 and reflection light reflected by the wiring line 22 coupling the second electrode 15 and the terminal electrode 21B together. This makes it possible to improve reliability of the light emitting device 1 and reliability of the display apparatus 100 including the same.

In addition, light leakage from the light emitting element 10 becomes tolerable to some extent. This enables use of a light emitting element having higher light emission efficiently as the light emitting element 10. This makes it possible to improve degree of freedom of the light emitting element in terms of structure, thus providing a display apparatus with higher luminance.

Description is given next of a second embodiment and a modification example of the disclosure. It is to be noted that constituent elements corresponding to those of the light emitting device 1 of the forgoing first embodiment are denoted by the same reference characters, and description thereof will be omitted.

2. Second Embodiment

FIG. 8 schematically illustrates a cross-sectional configuration of a light emitting device (a light emitting device 2) according to the second embodiment of the present disclosure. As with the first embodiment, the light emitting device 2 is preferably applicable as a display pixel of a display apparatus called an LED display, for example. The light emitting device 2 of the present embodiment is different from that of the foregoing first embodiment in that, for example, the light shielding layer 42 provided between the light emitting element 10 disposed above the substrate 31 and the substrate 31 is configured by a metal film.

The light emitting device 2 has a configuration in which the light emitting element 10 is mounted above the substrate 31 through, e.g., the terminal electrodes 21. The light emitting element 10 has the first electrode 14 on the first surface (the lower surface thereof, the surface S1) that opposes the substrate 31 and the second electrode 15 on the second surface (the upper surface thereof, the surface S2) that is positioned on the opposite side of the first surface S1. The terminal electrodes 21 are disposed at predetermined intervals, and include the terminal electrode 21A and the terminal electrode 21B that are electrically separated from each other. The terminal electrode 21A is electrically coupled to the first electrode 14, and the terminal electrode 21B is electrically coupled to the second electrode 15. The present embodiment has a configuration in which the light shielding layer 42 is formed on the substrate 31, and further, an insulating layer 43 is formed on the substrate 31 to cover the light shielding layer 42.

The light shielding layer 42 is formed on a portion of the surface, or the entire surface, of the substrate 31, and is configured by, e.g., a metal film. Examples of a material of the metal film include titanium (Ti), a titanium alloy such as TiW, aluminum (Al), an Al alloy, gold (Au), an Au alloy, copper (Cu), a Cu alloy, nickel (Ni), palladium (Pd), and platinum (Pt). The light shielding layer 42 is formed by a single-layer film thereof or a multilayer film thereof. The light shielding layer 42 may have a thickness enough to shield light outputted from the light emitting element, and has a thickness of, e.g., 100 nm or more and 300 nm or less. As illustrated in FIG. 8, the light shielding layer 42 is desirably disposed in at least a position corresponding to a gap between the terminal electrode 21A and the terminal electrode 21B. In a case where the light shielding layer 42 is formed on the entire surface of the substrate 31, the light shielding layer 42 preferably has an opening positioned on inner side of a region that opposes the light emitting element 10 (a formation region of the light emitting element 10), e.g., in a position corresponding to a position opposing the opening 14H of the first electrode 14. This makes it possible to perform light irradiation from the substrate 31 when the light emitting element 10 is held above the substrate 31 using e.g., light curing resin.

The insulating layer 43 is provided to electrically insulate the terminal electrodes 21A and 21B from the light shielding layer 42. The insulating layer 43 includes, e.g., SiN, $SiO_2$, or $Al_2O_3$. The thickness of the insulating layer 43 is not particularly limited, but it is preferable to be, e.g., 200 nm or more, and to be, e.g., 300 nm or more and 500 nm or less.

As described above, in the present embodiment, the light shielding layer 42 is configured by a metal film. As can be seen, the configuration in which the light shielding layer 42 is configured by a metal film also makes it possible to achieve effects similar to those in the first embodiment.

In addition, in the present embodiment, the light shielding layer 42 is formed in only the position corresponding to the gap between the terminal electrode 21A and the terminal electrode 21B. This makes it possible to reduce the irregularities of the surface of the substrate 31 above which the light emitting element 10 is mounted.

3. Modification Example

FIG. 9 schematically illustrates a cross-sectional configuration of a light emitting device (a light emitting device 3) according to the modification example of the present disclosure. The light emitting device 3 of the modification example is different from those of the first and second embodiments, in that the adhesive 23 between the substrate 31 and the light emitting element 10 is provided to extend to continuously cover the side surface of the first electrode 14 and the side and upper surfaces of the terminal electrode 21A in the light emitting element 10. As can be seen, the adhesive 23 is provided to extend to the light emitting element 10 and the surroundings of the terminal electrode 21A above the substrate 31, thereby making it possible to hold the light emitting element 10 above the substrate 31, more firmly.

As above, the present disclosure is described with reference to the first and second embodiments and the modification example. However, the present disclosure is not limited to the foregoing embodiments, etc., and various modifications are possible.

For example, the present technology is not limited to the structure of the light emitting device 1 (and the light emitting device 1A) and the structure of the display apparatus 100 of the present embodiment. The present technology is also applicable to, e.g., a case where the light emitting device 1A having a package structure is bonded on the substrate 31 using soldering. For example, in a situation where the light emitting device 1A and the substrate 31 are bonded together using a soldering process, in some cases, the bond between the light emitting device 1A and the substrate 31 is reinforced using heat curing resin including soldering particles. In this case, a photosensitive resin is left below the light emitting element 10. In such a structure, the light shielding layer is provided adjacent to the package, thereby making it possible to reduce deterioration of the photosensitive resin.

It is to be noted that the effects described herein are mere examples and thus are not limiting. Further, other effects may be provided.

Moreover, for example, the present disclosure may have the following configuration.

(1)

A light emitting device including:

a substrate;

a light emitting element disposed above the substrate, and having electrodes on respective upper surface and lower surface of the light emitting element; and a light shielding layer provided between the substrate and the light emitting element.

(2)

The light emitting device according to (1), in which the light shielding layer has wavelength selectivity, and transmits light with a wavelength other than a wavelength of light outputted from the light emitting element.

(3)

The light emitting device according to (1) or (2), in which the light shielding layer transmits light with a wavelength other than a wavelength of light outputted from the light emitting element and other than a wavelength within a wavelength range ±50 nm from the wavelength of the light outputted from the light emitting element.

(4)

The light emitting device according to any one of (1) to (3), in which the light shielding layer includes a light reflective layer in which multiple layers having refractive indexes that are different from each other are alternately laminated.

(5)

The light emitting device according to any one of (1) to (3), in which the light shielding layer includes a metal film.

(6)

The light emitting device according to (5), in which the metal film has an opening positioned on inner side of a region that opposes the light emitting element.

(7)

The light emitting device according to any one of (1) to (6), further including a plurality of terminal electrodes provided between the light shielding layer and the light emitting element and electrically coupled to the electrodes of the light emitting element, in which one of the plurality of terminal electrodes is electrically coupled, through a conductive line disposed at a position spaced apart from a side surface of the light emitting element, to the electrode provided on an upper part of the light emitting element.

(8)

The light emitting device according to (7), in which the one of the terminal electrodes is provided at a location that is above the substrate and that is positioned on outer side of a region in which the substrate opposes the light emitting element, and has a gap between the one of the terminal electrodes and another terminal electrode of the plurality of terminal electrodes.

(9)

The light emitting device according to (8), in which the light shielding layer is provided in at least a position corresponding to the gap between the one of the terminal electrodes and the other terminal electrode.

(10)

The light emitting device according to (8) or (9), in which the other terminal electrode has an opening positioned on inner side of a region that opposes the light emitting element.

(11)

The light emitting device according to any one of (1) to (10), in which the light emitting element is embedded in an insulator.

(12)

The light emitting device according to (11), in which one or more light emitting elements is embedded in the insulator together with the light emitting element, the one or more light emitting elements outputs light with a mutually-different wavelength.

(13)

A display apparatus including:

a display panel having a plurality of pixels; and a drive circuit that drives the plurality of pixels on a basis of a picture signal unit, the plurality of pixels included in the display panel including a plurality of light emitting devices mounted above a substrate, the light emitting device including the substrate, a light emitting element disposed above the substrate, and having electrodes on respective upper surface and lower surface of the light emitting element; and a light shielding layer provided between the substrate and the light emitting element.

This application claims the benefit of Japanese Priority Patent Application JP2017-222580 filed with the Japan Patent Office on Nov. 20, 2017, the entire contents of which are incorporated herein by reference.

It should be understood by those skilled in the art that various modification, combinations, sub-combinations and alterations may occur depending on design requirements and other factors insofar as they are within the scope of the appended claims or the equivalents thereof.

The invention claimed is:

1. A light emitting device, comprising:

a substrate;

a light emitting element above the substrate, wherein the light emitting element comprises a first electrode on an upper surface of the light emitting element and a second electrode on a lower surface of the light emitting element;

a light shielding layer between the substrate and the light emitting element; and a plurality of terminal electrodes between the light shielding layer and the light emitting element, wherein
each terminal electrode of the plurality of terminal electrodes is electrically coupled to one of the first electrode or the second electrode, and
a first terminal electrode of the plurality of terminal electrodes has an opening positioned on an inner side of a region where the substrate opposes the light emitting element.

2. The light emitting device according to claim 1, wherein the light shielding layer has wavelength selectivity, and
the light shielding layer transmits light with a wavelength other than a wavelength of light outputted from the light emitting element.

3. The light emitting device according to claim 1, wherein the light shielding layer transmits light with a wavelength other than a wavelength of light outputted from the light emitting element and other than a wavelength within a wavelength range ±50 nm from the wavelength of the light outputted from the light emitting element.

4. The light emitting device according to claim 1, wherein the light shielding layer comprises a light reflective layer in which multiple layers having refractive indexes that are different from each other are alternately laminated.

5. The light emitting device according to claim 1, wherein the light shielding layer comprises a metal film.

6. The light emitting device according to claim 5, wherein the metal film has an opening positioned on the inner side of the region where the substrate opposes the light emitting element.

7. The light emitting device according to claim 1, wherein
a second terminal electrode of the plurality of terminal electrodes is electrically coupled, through a conductive line, to the first electrode on the upper surface of the light emitting element, and
the second terminal electrode is at a position spaced apart from a side surface of the light emitting element.

8. The light emitting device according to claim 7, wherein the second terminal electrode of the plurality of terminal electrodes is at a location that is above the substrate and that is positioned on an outer side of the region where the substrate opposes the light emitting element, and
a gap is between the second terminal electrode of the plurality of terminal electrodes and the first terminal electrode of the plurality of terminal electrodes.

9. The light emitting device according to claim 8, wherein the light shielding layer is in at least a position corresponding to the gap between the first terminal electrode and the second terminal electrode.

10. The light emitting device according to claim 1, wherein the light emitting element is embedded in an insulator.

11. The light emitting device according to claim 10, wherein at least one light emitting element is embedded in the insulator together with the light emitting element, the at least one light emitting element outputs light with a mutually-different wavelength.

12. A display apparatus, comprising:
a display panel having a plurality of pixels; and
a drive circuit configured to drive the plurality of pixels, wherein
a pixel of the plurality of pixels comprises a light emitting device,
the light emitting device is above a substrate, and
the light emitting device comprises:
a light emitting element above the substrate, wherein the light emitting element comprises a first electrode on an upper surface of the light emitting element and a second electrode on a lower surface of the light emitting element;
a light shielding layer between the substrate and the light emitting element; and
a plurality of terminal electrodes between the light shielding layer and the light emitting element, wherein
each terminal electrode of the plurality of terminal electrodes is electrically coupled to one of the first electrode or the second electrode, and
a terminal electrode of the plurality of terminal electrodes has an opening positioned on an inner side of a region where the substrate opposes the light emitting element.

* * * * *